(12) United States Patent
Cho

(10) Patent No.: US 7,859,319 B2
(45) Date of Patent: Dec. 28, 2010

(54) SETUP/HOLD TIME CONTROL CIRCUIT

(75) Inventor: Joo Hwan Cho, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 37 days.

(21) Appl. No.: 11/963,977

(22) Filed: Dec. 24, 2007

(65) Prior Publication Data

US 2009/0033396 A1    Feb. 5, 2009

(30) Foreign Application Priority Data

Jul. 31, 2007    (KR) .................... 10-2007-0077013

(51) Int. Cl.
*G06G 1/04* (2006.01)

(52) U.S. Cl. .................. 327/291; 327/198; 327/141; 327/202; 327/293

(58) Field of Classification Search ......... 327/198–199, 327/141, 142, 202, 215, 201, 293, 295–296
See application file for complete search history.

(56) References Cited

U.S. PATENT DOCUMENTS 5,043,596 A * 8/1991 Masuda et al. .............. 327/297
5,644,547 A    7/1997 Grishakov et al.
6,466,492 B2 * 10/2002 Ikeda ......................... 365/195
6,483,376 B1 * 11/2002 Bienvenu et al. ............. 327/536
6,630,850 B2 * 10/2003 Eto et al. ..................... 327/141
7,317,362 B2 *  1/2008 Sakuma et al. ............... 331/111

FOREIGN PATENT DOCUMENTS

JP    2003-208303 A    7/2003

* cited by examiner

*Primary Examiner*—Lincoln Donovan
*Assistant Examiner*—Shikha Goyal
(74) *Attorney, Agent, or Firm*—Ladas & Parry LLP

(57) ABSTRACT

A setup/hold time control circuit includes a reference signal output unit that sets any one of multiple ports as a reference port and buffers a signal input through the reference port to output as a reference signal. The setup/hold time control circuit also includes a plurality of comparative signal output units that set the remaining ports as comparative ports. The comparative signal output unit synchronizes signals that are input from the comparative ports with the reference signal and outputs the signals as internal signals. The setup/hold time control circuit improves high speed operation of a semiconductor memory device by improving upon the setup/hold time difference between multiple ports.

21 Claims, 8 Drawing Sheets

SETUP/HOLD TIME CONTROL CIRCUIT

CROSS-REFERENCE TO RELATED APPLICATIONS

The present application claims priority to Korean patent application number 10-2007-0077013 filed on Jul. 31, 2007, which is incorporated herein by reference in its entirety.

BACKGROUND OF THE INVENTION

The present invention relates to a semiconductor memory device, and more precisely to a setup/hold time control circuit which controls a setup/hold time of signals input through multiple ports.

In a semiconductor memory device input signals such as addresses, commands, and data are input from an outside source through ports.

Control of a setup time and a hold time for each of the input signals is necessary to improve the performance of the semiconductor memory device.

Margin and timing are important factors when controlling the setup time and the hold time of the input signals.

The semiconductor memory device is typically configured with a buffer to sufficiently secure the margin of the setup time and the hold time of the input signals for each port. The buffer is used to obtain the margin of the setup time and the hold time required by product specifications.

Further, the semiconductor memory device must have the timing between the input signals controlled in order to improve the setup/hold performance.

In a high-speed operating graphic memory, the input signals that are input through multiple ports are controlled simultaneously. As such, if the setup/hold timings of the input signals between each port are not the same, it is difficult to perform the high-speed operation. For example, in a case where a data bus of 32 bits is controlled in a unit of 8 bits, the input signals that are input to the 8 ports must have same setup/hold timing.

As the semiconductor memory device increases to a high speed, the input signals are required to have lower setup/hold time. However, as the production process of semiconductor memory devices is advanced, the critical dimension becomes fine and a fine difference in the gates influences the setup/hold time of each port. Consequently, it becomes difficult to control the setup/hold timings of the input signals such that they are the same for the multiple ports.

SUMMARY OF THE INVENTION

The present invention provides a setup/hold time control circuit which improves setup/hold timing between each port by synchronizing signals that are input through multiple ports.

In order to improve the setup/hold timing between ports, the setup/hold time control circuit according to the present invention comprises a reference signal output unit that sets any one of multiple ports as a reference port and buffers a signal that is input from the reference port and outputs the signal as a reference signal; and a comparative signal output unit that sets the remaining ports as comparative ports and synchronizes signals input from the comparative ports with the reference signal and outputs the signal as an internal signal.

Preferably, the reference signal output unit comprises a buffer unit that outputs the signal, which was input from the reference port, as the reference signal.

Preferably, the setup/hold time circuit includes a plurality of comparative signal output units each corresponding to the comparative ports.

Preferably, the comparative signal output unit comprises a buffer unit receiving the signal input from the comparative port and outputting the signal as the comparative signal; a comparison latch unit comparing the comparative signal with the reference signal in order to output selectively enabled control signals; and a control unit synchronizing an output time point of the comparative signal with an output time point of the reference signal using the control signals.

Preferably, the comparison latch unit comprises a comparing unit for comparing the comparative signal with the reference signal, wherein the comparing unit outputs a first detect signal and a second detect signal, if a test mode signal is enabled; and a latch unit that receives the first and second detect signals and selectively enables and outputs the first and the second control signals.

Preferably, the comparing unit comprises a first comparing unit, wherein the first comparing unit enables and outputs the first detect signal earlier than the second detect signal if an input time point of the comparative signal is faster than that of the reference signal; and a second comparing unit, wherein the second comparing unit enables and outputs the second detect signal earlier than the first detect signal if an input time point of the comparative signal is slower than that of the reference signal.

Preferably, the first comparing unit comprises a first NAND gate NAND-combining the comparative signal with the reference signal inverted; a first PMOS transistor, wherein an output of the first NAND gate controls a delivery of a power supply voltage from a source end into a drain end; a second NAND gate controlling an output of the first PMOS transistor in accordance with the test mode signal; an inverter inverting an output of the second NAND gate to latch the output of the first PMOS transistor; and a second inverter inverting the output of the second NAND gate to output as the first detect signal.

Preferably, the second comparing unit comprises a NOR gate NOR-combining the comparative signal with the reference signal inverted; a third inverter inverting an output of the NOR gate; a second PMOS transistor, wherein an output of the third inverter controls a delivery of a power supply voltage applied from a source end into a drain end; a third NAND gate controlling an output of the second PMOS transistor in accordance with the test mode signal; a fourth inverter inverting an output of the third NAND gate to latch the output of the second PMOS transistor; and a fifth inverter inverting the output of the third NAND gate to output as the second detect signal.

Preferably, the latch unit comprises a first latch unit enabling the first control signal to be output if the first detect signal is enabled earlier than the second detect signal; and a second latch unit enabling the second control signal to be output if the second detect signal is enabled earlier than the first detect signal.

Preferably, the first latch unit comprises a fourth NAND gate to which the first detect signal is input; a fifth NAND gate NAND-combining the second detect signal and an output of the fourth NAND gate, where the fifth NAND gate has its output connected to an input of the fourth NAND gate; and a sixth inverter inverting the output of the fourth NAND gate to output it as the first control signal.

Preferably, the second latch unit comprises a sixth NAND gate to which the first detect signal is input; a seventh NAND gate NAND-combining the second detect signal and an output of the sixth NAND gate, where the sixth NAND gate has its output connected to an input of the sixth NAND gate; and a seventh inverter inverting the output of the seventh NAND gate to output as the second control signal.

Preferably, the control unit comprises a first control unit reducing a delay of the comparative signal while the second control signal is enabled; and a second control unit increasing a delay of an output signal of the first control unit to output as the internal signal while the first control signal is enabled.

Preferably, the first control unit comprises a first path selecting unit selecting an output path of the comparative signal in accordance with the second control signal; a first delay unit, which is selected if the second control signal is disabled, to delay the comparative signal by a prescribed time; and a first output unit logically combining an output of the first path selecting unit selected if the second control signal is enabled with an output of the first delay unit to output the combined result.

Preferably, the first path selecting unit comprises an eighth NAND gate outputting the comparative signal to the first delay unit if the second control signal is disabled; and a ninth NAND gate outputting the comparative signal to the first output unit if the second control signal is enabled.

Preferably, the first output unit comprises a tenth NAND gate NAND-combining an output of the first path selecting unit with an output of the first delay unit; and an eighth inverter inverting an output of the tenth NAND gate.

Preferably, the second control unit comprises a second path selecting unit selecting a path of the output signal of the first control unit in accordance with the first control signal; a second delay unit, which is selected if the first control signal is enabled, to delay the output signal of the first control unit by a prescribed time; and a second output unit which logically combines an output of the second path selecting unit selected if the first control signal is disabled with an output of the second delay unit and outputting the combined result.

Preferably, the second path selecting unit comprises an eleventh NAND gate outputting the output signal of the first control unit to the second output unit if the first control signal is disabled; and a twelfth NAND gate outputting the output signal of the first control unit to the second delay unit if the first control signal is enabled.

Preferably, the second output unit comprises a thirteenth NAND gate NAND-combining an output of the second path selecting unit with an output of the second delay unit; and a ninth inverter inverting an output of the tenth NAND gate.

In order to improve the setup/hold timing between ports, the setup/hold time control circuit according to another embodiment of the present invention comprises a first buffer outputting a signal input from a first port as a reference signal; a second buffer outputting a signal input from a second port as a comparative signal; a comparison latch unit comparing input time points of the reference signal and the comparative signal and outputting a signal corresponding to the comparison result as a control signal if the test mode is enabled; and a control unit outputting the comparative signal as an internal signal by using the control signal to control an output time point of the comparative signal such that the comparative signal is synchronized with an output time point of the reference signal.

Preferably, the comparison latch unit comprises a comparing unit for comparing an input time point of the reference signal with that of the comparative signal to output a first detect signal and a second detect signal if the test mode signal is enabled; and a latch unit selectively enabling the control signal in accordance with an enable sequence of the first and second detect signals and outputting the control signal.

Preferably, the comparing unit comprises a first comparing unit making an enable time point of the first detect signal earlier than that of the second detect signal if the input time point of the comparative signal is faster than that of the reference signal; and a second comparing unit making the enable time point of the second detect signal earlier than that of the first detect signal if the input time point of the comparative signal is slower than that of the reference signal.

Preferably, the latch unit outputs the control signal as an enabled first control signal if the first detect signal is enabled earlier than the second detect signal and an enabled second control signal if the second detect signal is enabled earlier than the first detect signal.

Preferably, the control unit comprises a first control unit reducing a delay of the comparative signal while the second control signal is enabled; and a second control unit increasing a delay of an output signal of the first control unit while the first control signal is enabled, wherein the second control unit outputs the delay signal as the internal signal Preferably, the first control unit comprises a first path selecting unit selecting a path of the comparative signal in accordance with the second control signal; a first delay unit, which is selected if the second control signal is disabled, to delay the comparative signal by a prescribed time; and a first output unit logically combining an output of the first path selecting unit selected if the second control signal is enabled with an output of the first delay unit and outputting the combined result.

Preferably, the second control unit comprises a second path selecting unit selecting a path of the output signal of the first control unit in accordance with the first control signal; a second delay unit, which is selected if the first control signal is enabled, to delay the output signal of the first control unit by a prescribed time; and a second output unit logically combining an output of the second path selecting unit selected if the first control signal is disabled with an output of the second delay unit and outputting the combined result.

DESCRIPTION OF SPECIFIC EMBODIMENTS

Hereinafter, preferred embodiments of the present invention will be described in detail with reference to the accompanying drawings.

The present invention provides a setup/hold time control circuit that controls the setup/hold times of the input signals such that the setup/hold times of the input signals of multiple ports are substantially the same. Herein, the input signals of the multiple ports contain a reference signal, and the setup/hold time of another input signals is controlled by the reference signal.

Figure 1:
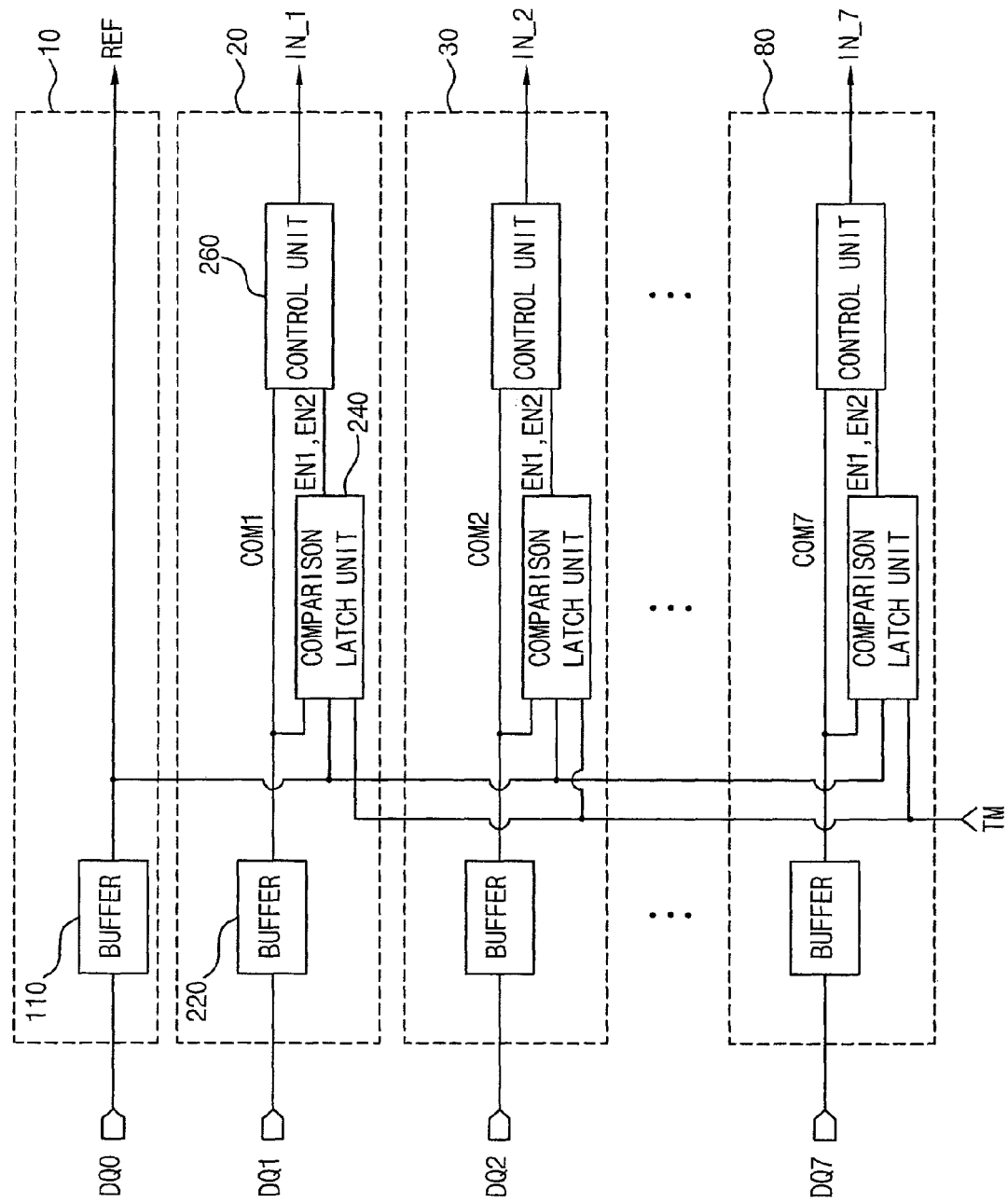
FIG. 1 is a block diagram showing a setup/hold time control circuit that controls the setup/hold time of multiple ports according to one embodiment of the present invention.

Referring to FIG. 1, the setup/hold time control circuit according to one embodiment of the present invention is applied for the input signals of the multiple ports. One of the input signals is used as a reference signal and the other input signals are used as comparative signals.

The setup/hold time control circuit of the present invention includes a reference signal output unit 10 connected to the port where the reference signal is input. Comparative signal output units 20 to 80 are connected to the ports where the input signals (except the reference signal) are input. Herein, for the purpose of explanation, the number of the ports, which are simultaneously controlled, is limited to 8 (DQ0 to DQ7).

The reference signal output unit 10 does not have to correspond to DQ0, and may correspond to any one of the ports DQ0 to DQ7. In FIG. 1, the reference signal output unit 10 corresponds to DQ0. The reference signal output unit 10 includes a buffer unit 110 connected to the port DQ0. The buffer unit 100 buffers the signal that is input to the port DQ0 before outputting the signal as the reference signal REF so as to secure the margin of the setup/hold time.

Each comparative signal output unit 20 includes a buffer unit 220, a comparison latch unit 240, and a control unit 260. As an example, the comparative signal output unit 20 connected to the port DQ1 will be explained.

The buffer unit 220 buffers the signal that is input through the port DQ1 before outputting as a comparative signal COM1 so as to secure the margin of the setup/hold time. The comparison latch unit 240 compares the reference signal REF to the comparative signal COM1 in response to a test mode signal TM and outputs control signals EN1 or EN2 that are selectively enabled according to the comparison result. The control unit 260 outputs the comparative signal COM1 as an internal signal IN_1 having its output timing synchronized to the output timing of the reference signal REF in accordance with the control signal EN1 or EN2.

The buffer unit 220 can be composed of buffers that buffer the input signal of the port DQ1 and output the input signal as the comparative signal COM1.

Figure 2:
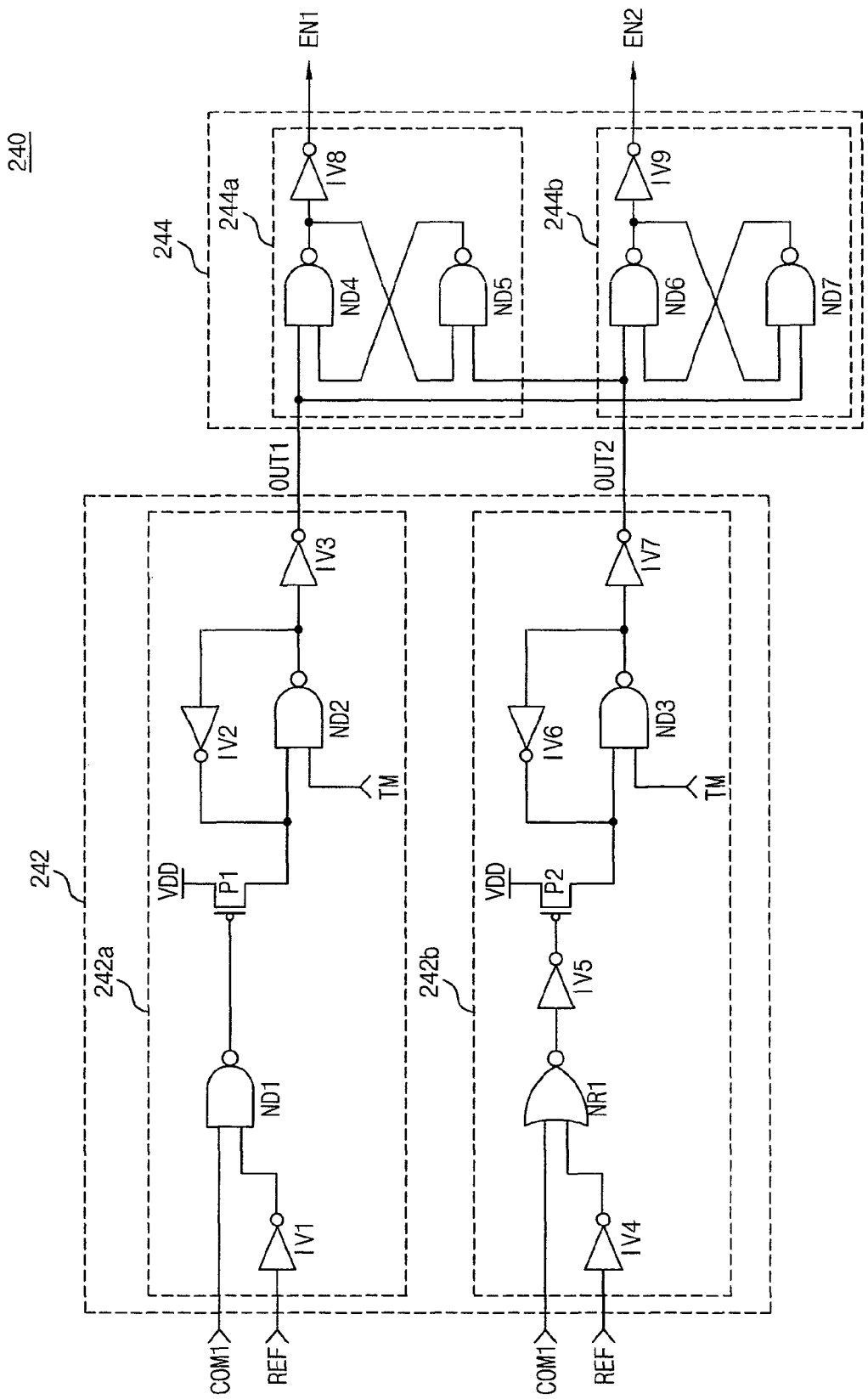
FIG. 2 is a detailed circuit diagram showing the comparison latch unit of FIG. 1.

Referring to FIG. 2, the comparison latch unit 240 includes a comparing unit 242 and a latch unit 244.

The comparing unit 242 includes first and second comparing units 242a, 242b that output detect signals OUT1, OUT2. The output detect signals OUT1, OUT2 provide different time points when input timings of the reference signal REF and the comparative signal COM1 are compared.

The first comparing unit 242a includes a PMOS transistor P1, NAND gates ND1 and ND2 and inverters IV1 to IV3. The first comparing unit 242a outputs a high level for the detect signal OUT1 when the timing of the comparative signal COM1 is faster than that of the reference signal REF.

More specifically, the comparison signal COM1 is input into the NAND gate ND1, and the reference signal REF is inverted by the inverter IN1 and input into the NAND gate ND1. The output of the NAND gate ND1 is connected to the gate end of PMOS transistor P1 and controls the delivery of a power supply voltage VDD from a source end to a drain end of the PMOS transistor P1. The NAND gate ND2 is controlled to invert the output of the PMOS transistor P1 by the test mode signal TM. The inverter IV2 provides an inverting feedback path for the NAND gate ND2. The NAND gate ND2 and the inverter IV2 form a latch circuit. The inverter IV3 inverts an output of the NAND gate ND2, and the output of the inverter IV3 is the detect signal OUT1.

The second comparing unit 242b includes a PMOS transistor P2, a NOR gate NR1, a NAND gate ND3 and inverters IV4 to IV7. The second comparing unit 242b outputs a high level detect signal OUT2 when the timing of the reference signal REF is faster than that of the comparison signal COM1.

More specifically, the comparison signal COM1 is ed into the NOR gate NR1, and the reference signal REF is inverted by the inverter IV4. The output of the NOR gate NR1 inverted by the inverter IV5 is connected to the gate of the PMOS transistor P2 and controls the delivery of a voltage supply voltage VDD from a source end to a drain end of the PMOS transistor P2. The NAND gate ND3 is controlled to invert an output of the PMOS transistor P2 by the test mode signal TM. The inverter IV6 provides an inverting feedback path for the NAND gate ND3. The NAND gate ND3 and the inverter IV6 form a latch circuit. The inverter IV7 inverts an output of the NAND gate ND3, and the output of the inverter IV7 is the OUT2.

In other words, the comparing unit 242 has different logic circuits (that is, IV1, ND1 and IV4, NR1, IV5) that precede the PMOS transistors P1, P2 of the first comparing unit 242a and the second comparing unit 242b, and this difference creates a timing difference between the signals applied to each PMOS transistors P1, P2.

As such, the comparison unit 242 compares the input time points of the reference signal REF and the comparative signal COM1 when the test mode signal TM is enabled and outputs the detect signal OUT1, OUT2 in which the enabled time points are sequential in accordance with the comparison result.

The latch unit 244 is composed of a first latch unit 244a and a second latch unit 244b which latch and invert the detect signals OUT1, OUT2 to output the control signals EN1, EN2 which are selectively enabled.

The first latch unit 244a includes NAND gates ND4, ND5 and an inverter IV8.

Herein, the detect signals OUT1, OUT2 are into NAND gates ND4, ND5 respectively, and the outputs of the NAND gates ND4, ND5 are cross-coupled with each other so that their outputs are provided to each other's input. The inverter IV8 inverts the output of the NAND gate ND4, and the output of the inverter IV8 is the control signal EN1.

The second latch unit 244b includes NAND gates ND6, ND7 and an inverter IV9.

More specifically, the detect signals OUT1, OUT2 are input into the NAND gates ND6, ND7 respectively, and the outputs of the NAND gates ND6, ND7 are cross-coupled with each other so that their outputs are provided to each other's input. The inverter IV9 inverts the output of the NAND gate ND6, and the output of the inverter IV9 is the control signal EN2.

In other words, the latch unit 244 outputs the control signals EN1, EN2 which are selectively enabled in correspondence with the enable time point of the detect signals OUT1, OUT2 to control the output time point of the comparative signal COM1.

Figure 3:
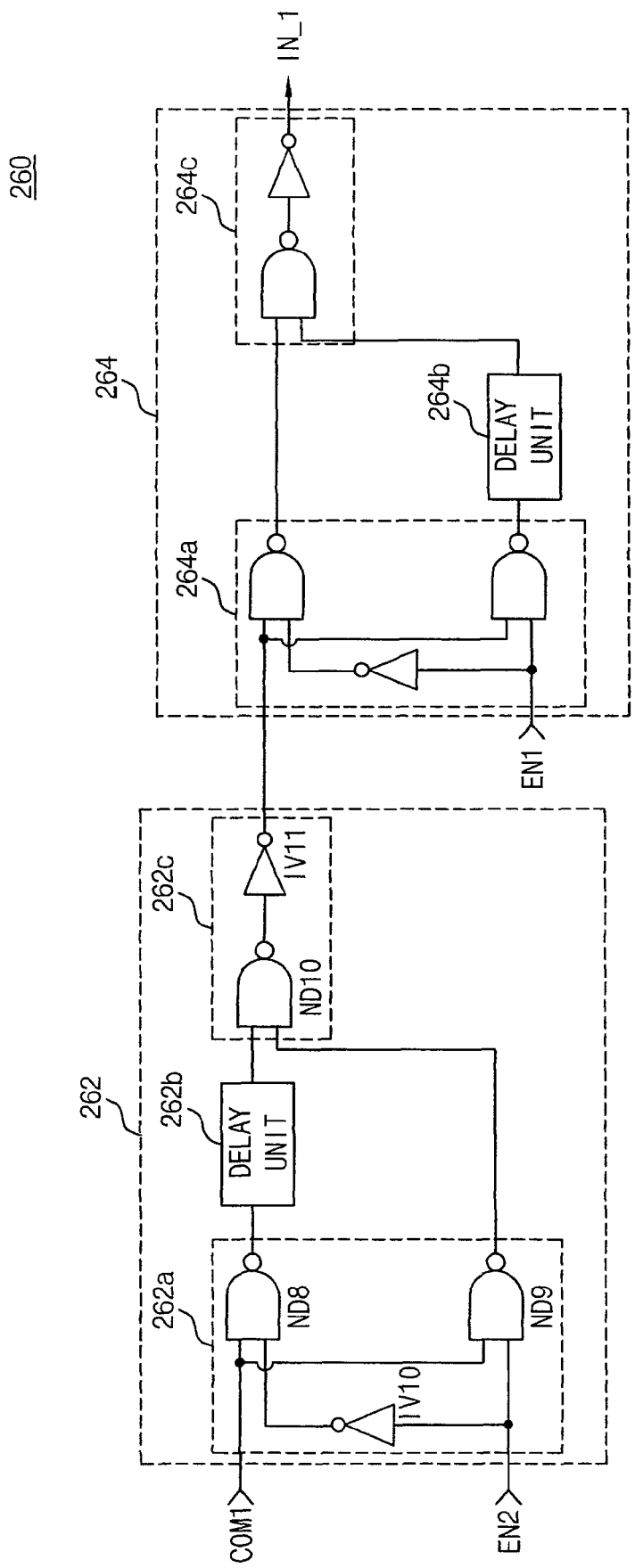
FIG. 3 is a detailed circuit diagram showing the control unit of FIG. 1.

Referring to FIG. 3, the control unit 260 includes a first control unit 262 controlling a delay of the comparative signal COM1 in accordance with the control signal EN2, and a second control unit 264 controlling a delay of the signal output from the first control unit 262 in accordance with the control signal EN1, and whose output is the internal signal IN_1.

The first control unit 262 includes a path selecting unit 22a, a delay unit 262b, and an output unit 262c.

Herein, the path selecting unit 262a selects an output path of the comparative signal COM1 in accordance with the control signal EN2. The delay unit 262b delays an output of the path selecting unit 262a selected in accordance with the disabled control signal EN2. The output unit 262c logically combines the output of the path selecting unit 262a selected in accordance with the enabled control signal EN2, with an output of the delay unit 262b and outputs the combined result as the output signal.

More specifically, the path selecting unit 262a includes NAND gates ND8, ND9 and an inverter IV10.

Herein, the comparative signal COM1 is input into the NAND gate ND8, and the control signal EN2 is inverted by the inverter IV10. The NAND gate ND9 NAND-combines the comparative signal COM1 with the control signal EN2. As such, the path selecting unit 262a delivers the comparative signal COM1 to the output unit 262c through the NAND gate ND9 if the control signal EN2 is enabled, and delivers the comparative signal COM1 to the delay unit 262b through the NAND gate ND8 if the control signal EN2 is disabled.

The delay unit 262b is configured with a plurality of inverters and outputs the input signal after delaying it by a prescribed time. At this time, the number of the inverters is preferably an even number.

The output unit 262c includes a NAND gate ND10 and an inverter IV11. The output of the NAND gate ND9 and the output of the delay unit 262b are input into the NAND gate ND10, and the inverter IV11 inverts an output of the NAND gate ND10.

The second control unit 264 includes a path selecting unit 264a, a delay unit 264b, and an output unit 264c.

More specifically, the path selecting unit 264a selects the output path of the signal output from the first control unit 262 in accordance with the control signal EN1. The delay unit 264b delays an output of the path selecting unit 264a selected in accordance with the enabled control signal EN1. The output unit 264c logically combines the output of the path selecting unit 264a selected in accordance with the disabled control signal EN1, with an output of the delay unit 264b to output the combined result as the internal signal IN_1.

Herein, since the path selecting unit 264a, the delay unit 264b, and the output unit 264c included in the second control unit 264 are constructed identically to the path selecting unit 262a, the delay unit 262b and the output unit 262c included in the second control unit 262, detailed explanations of them will be omitted.

Figure 4A:
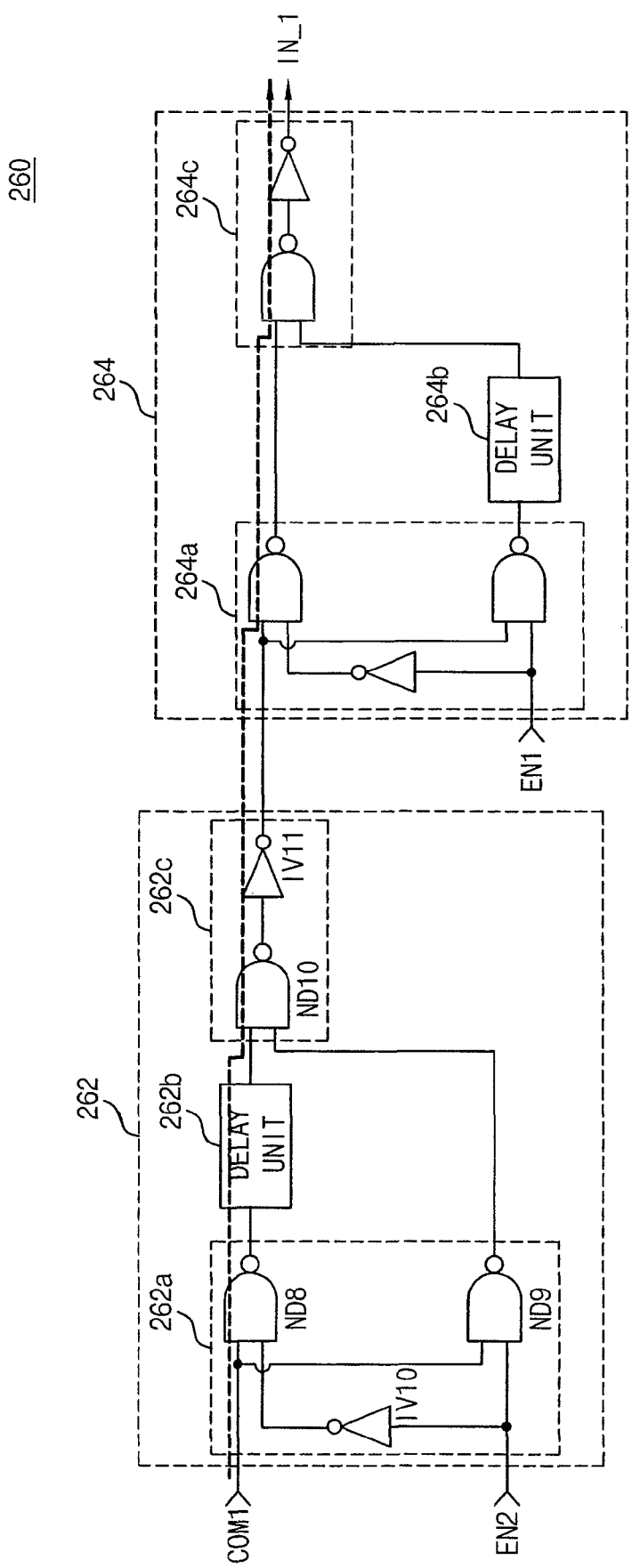
FIG. 4a to FIG. 4c are drawings illustrating paths selected by the control signal.
Figure 4B:
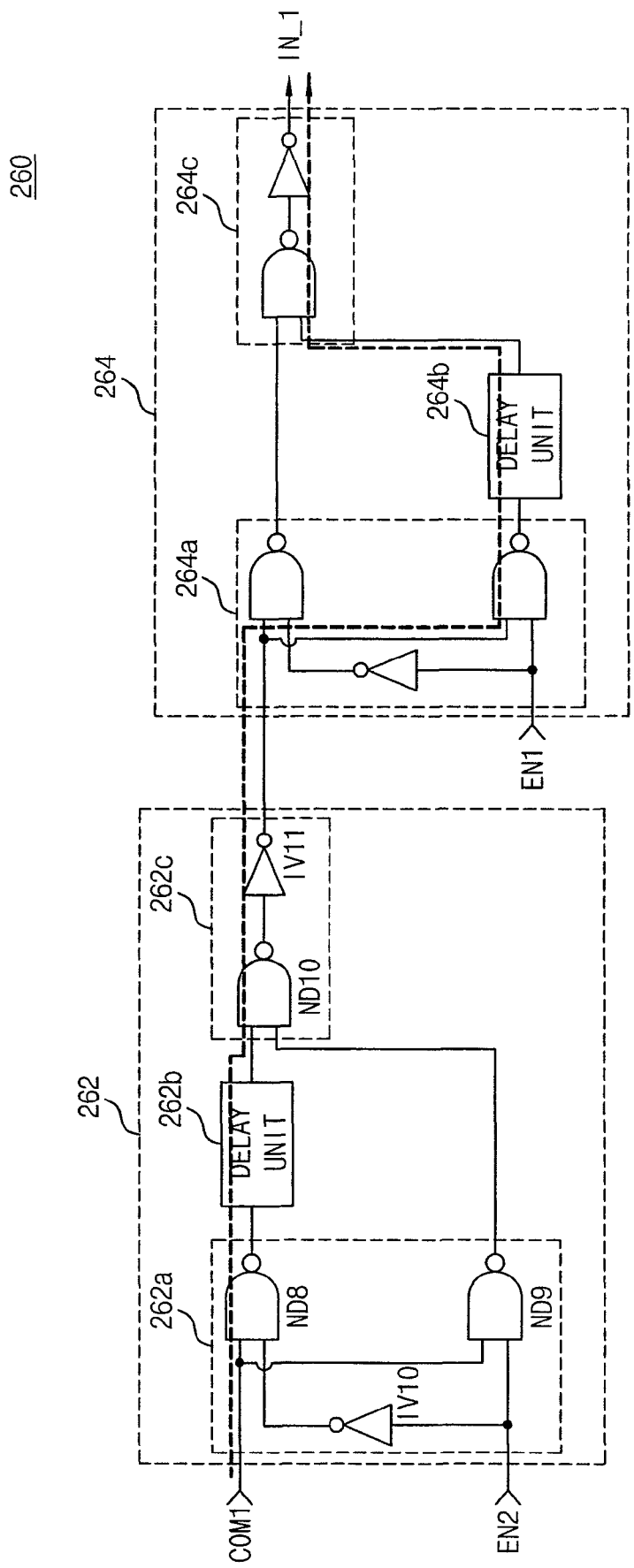
Figure 4C:
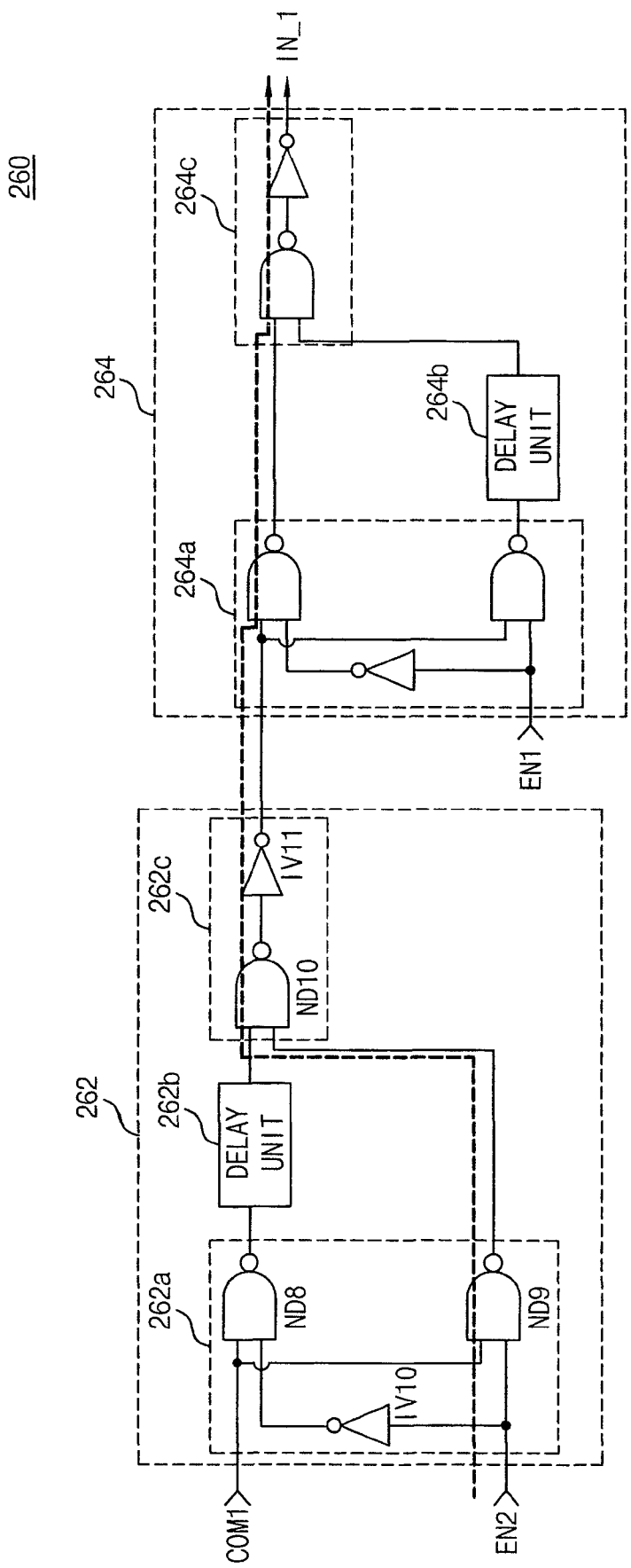

FIG. 4a to FIG. 4c are used to aid in the explanation of the operation of the control unit 260 controlling an output time point of the comparison signal COM1 in accordance with the control signal EN1, EN2.

Referring to FIG. 4a, the control unit 260 controls an output time point of the comparative signal COM1 in accordance with the disabled control signals EN1, EN2 in a default state.

That is, the comparative signal COM1 is delayed by a prescribed time via the path selecting unit 262a, the delay unit 262b, and the output unit 262c of the first control unit 262 and is output as the internal signal IN_1 via the path selecting unit 264a and the output unit 264c of the second control unit 264.

Referring to FIG. 4b, the control unit 260 controls the output time point of the comparative signal COM1 in accordance with the enabled control signal EN1 and the disabled control signal EN2. This case occurs when the input time point of the comparative signal COM1 is faster than that of the reference signal REF in a test state.

More specifically, the comparative signal COM1 is delayed by a prescribed time via the path selecting unit 262a, the delay unit 262b, and the output unit 262c of the first control unit 262, and is further delayed via the path selecting unit 264a, the delay unit 264b, and the output unit 264c of the second control unit 264. The signal is then output as the internal signal IN_1.

That is, the comparative signal COM1 is delayed by the delay units 262b, 264b and output as the internal signal IN_1, thus the output time point of the internal signal IN_1 is delayed such that the output time point of the internal signal IN_1 is substantially synchronized with the output time point of the reference signal REF.

Referring to FIG. 4c, the control unit 260 controls the output time point of the comparative signal COM1 in accordance with the disabled control signal EN1 and the enabled control signal EN2. This case occurs if the input time point of the comparative signal COM1 is slower than that of the reference signal REF in a test state.

More specifically, the comparative signal COM1 is delivered via the path selecting unit 262a and the output unit 262c of the first control unit 262 and is output as the internal signal IN_1 via the path selecting unit 264a and the output unit 264c of the second control unit 264.

The comparative signal COM1 is output as the internal signal IN_1 with less delay than the default state, as such the output time point of the internal signal IN_1 is earlier in order to substantially synchronize the output time point of the internal signal IN_1 with the output time point of the reference signal REF.

Figure 5A:
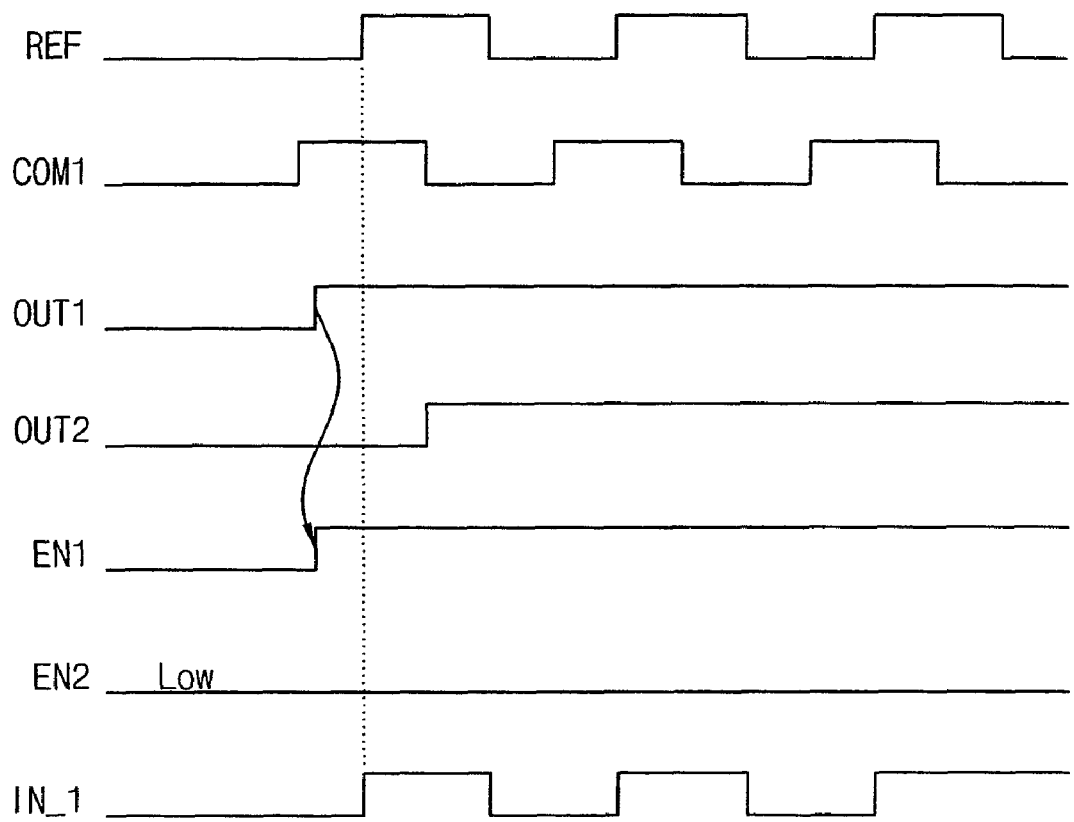
FIG. 5a to FIG. 5b are operational waveform diagrams of the setup/hold time control circuit.
Figure 5B:
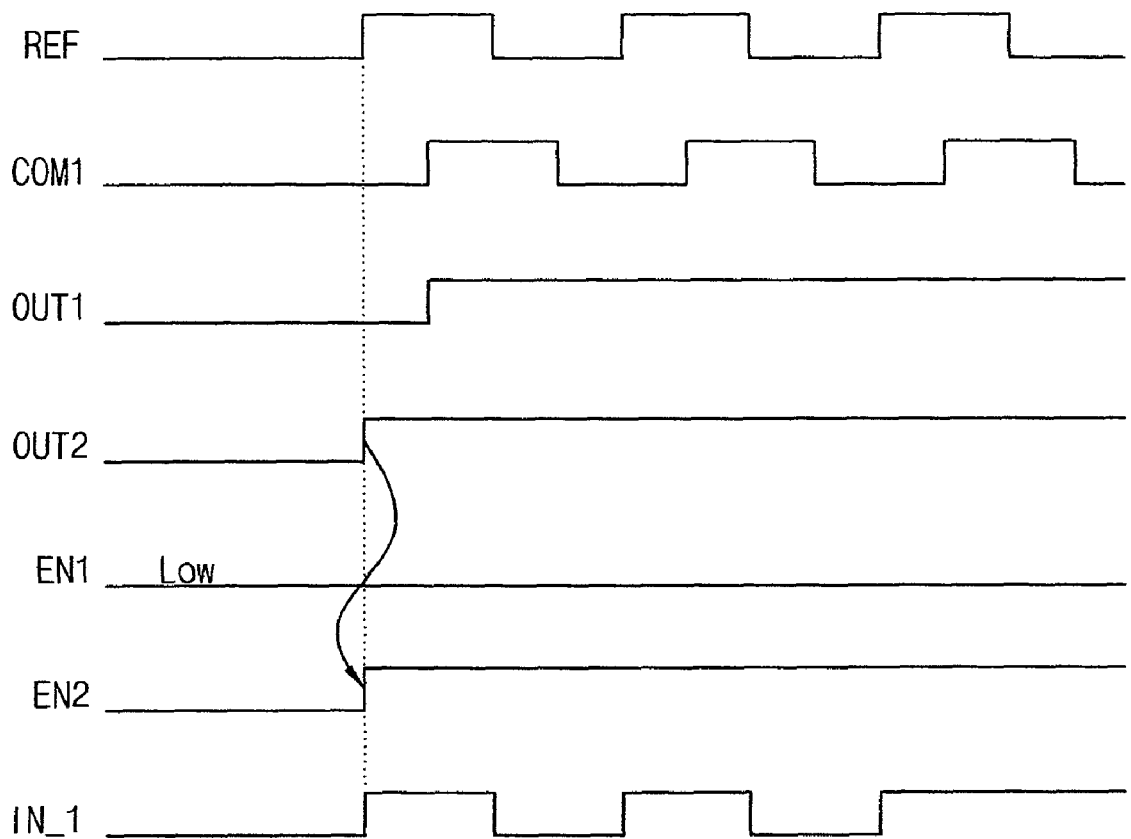

Referring to FIG. 5a to FIG. 5b, the operational waveform of the setup/hold time control circuit according to one embodiment of the present invention will be explained.

Referring to FIG. 5a, if the input time point of the comparative signal COM1 is faster than the input time point of the reference signal REF, the comparison latch unit 240 is enabled at a time point when the detect signal OUT1 precedes the detect signal OUT2. This enables the control signal EN1 to be output, and the control unit 260 delays the comparative signal COM1 by more than the delay time of the default state. The delayed signal is output as the internal signal IN_1. As such, the output time point of the internal signal IN_1 is controlled based on the output time point of the reference signal REF.

Referring to FIG. 5b, if the input time point of the comparative signal COM1 is slower than that of the reference signal REF, the comparison latch unit 240 is enabled at a time point when the detect signal OUT2 precedes the detect signal OUT1. This enables the control signal EN2 to be output. The control unit 260 delays the comparative signal COM1 by less than the delay time of the default state in accordance with the enabled control signal EN2, and the signal is output as the internal signal IN_1. As such, the output time point of the internal signal IN_1 is controlled based on the output time point of the reference signal REF.

The comparative signal output units 30 to 80 shown in FIG. 1 have the same configuration and operation as the above-mentioned comparative signal output unit 20. Therefore, the signals that are input via the ports DQ2 to DQ7 are output as the internal signals IN_2 to IN_7, each having a setup/hold time that is synchronized with the reference signal REF.

As described above, by designating one of a plurality of input signals, which are input through ports, as a reference signal and comparing each of the signals input through the ports to the reference signal, the output time points of each signal can be synchronized to the setup/hold time of the reference signal. As a result, the setup/hold time difference between each port can be improved. The present invention provides a semiconductor memory device that can simultaneously control the signals input through the multiple ports.

Therefore, the present invention provides an advantage in that the setup/hold time difference between each port can be improved by providing the above described setup/hold time control circuit which controls the output time point of the signals input through the multiple ports.

Further, in the present invention, it is possible to enhance the high speed operation of the semiconductor memory device by improving the setup/hold time difference between multiple ports.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A setup/hold time control circuit, comprising:
    a reference signal output unit buffers a signal that is input from a reference port and outputs the signal as a reference signal; and
    a plurality of comparative signal output units, each of which receives a corresponding input signal through a corresponding comparative port and synchronizes the corresponding input signal with the reference signal to output an internal signal, wherein each of the comparative signal output units includes:
    a buffer unit receiving the input signal input from the corresponding comparative port and outputting the comparative signal;
    a comparison latch unit comparing the comparative signal with the reference signal in order to output selectively enabled control signals; and
    a control unit synchronizing an output time point of the comparative signal with an output time point of the reference signal using the control signals, wherein comparison latch unit includes a comparing unit and a latch unit, the comparing unit compares the comparative signal with the reference signal and outputs a first detect signal and a second detect signal, if a test mode signal is enabled, and the latch unit receives the first and second detect signals and selectively enables and outputs the first and the second control signals.

2. The setup/hold time control circuit as set forth in claim 1, wherein the reference signal output unit comprises a buffer unit that receives the signal input from the reference port and outputs the reference signal.

3. The setup/hold time control circuit as set forth in claim 1, wherein the comparing unit comprises:
    a first comparing unit, wherein the first comparing unit enables and outputs the first detect signal earlier than the second detect signal if an input time point of the comparative signal is faster than that of the reference signal; and
    a second comparing unit, wherein the second comparing unit enables and outputs the second detect signal earlier than the first detect signal if an input time point of the comparative signal is slower than that of the reference signal.

4. The setup/hold time control circuit as set forth in claim 3, wherein the first comparing unit comprises:
    a first NAND gate NAND-combining the comparative signal with the reference signal inverted; a first PMOS transistor, wherein an output of the first NAND gate controls a delivery of a power supply voltage from a source end of the first PMOS transistor to a drain end of the first PMOS transistor;
    a second NAND gate controlling an output of the first PMOS transistor in accordance with the test mode signal;
    an inverter inverting an output of the second NAND gate to latch the output of the first PMOS transistor; and
    a second inverter inverting the output of the second NAND gate to output as the first detect signal.

5. The setup/hold time control circuit as set forth in claim 3, wherein the second comparing unit comprises:
    a NOR gate NOR-combining the comparative signal with the reference signal inverted;
    a third inverter inverting an output of the NOR gate;
    a second PMOS transistor wherein an output of the third inverter controls a delivery of a power supply voltage from a source end of the first PMOS transistor to a drain end of the first PMOS transistor;
    a third NAND gate controlling an output of the second PMOS transistor in accordance with the test mode signal;
    a fourth inverter inverting an output of the third NAND gate to latch the output of the second PMOS transistor; and
    a fifth inverter inverting the output of the third NAND gate to output as the second detect signal.

6. The setup/hold time control circuit as set forth in claim 1, wherein the latch unit comprises:
    a first latch unit enabling the first control signal to be output if the first detect signal is enabled earlier than the second detect signal; and
    a second latch unit enabling the second control signal to be output if the second detect signal is enabled earlier than the first detect signal.

7. The setup/hold time control circuit as set forth in claim 6, wherein the first latch unit comprises:
    a fourth NAND gate to which the first detect signal is input;
    a fifth NAND gate NAND-combining the second detect signal and an output of the fourth NAND gate, the fifth NAND gate having its output connected to an input of the fourth NAND gate; and
    a sixth inverter inverting the output of the fourth NAND gate to output it as the first control signal.

8. The setup/hold time control circuit as set forth in claim 6, wherein the second latch unit comprises:
    a sixth NAND gate to which the first detect signal is input;
    a seventh NAND gate NAND-combining the second detect signal and an output of the sixth NAND gate, the seventh NAND gate having its output connected to an input of the sixth NAND gate; and
    a seventh inverter inverting the output of the seventh NAND gate to output as the second control signal.

9. The setup/hold time control circuit as set forth in claim 1, wherein the control unit comprises:
    a first control unit reducing a delay of the comparative signal while the second control signal is enabled; and
    a second control unit increasing a delay of an output signal of the first control unit to output as the internal signal while the first control signal is enabled.

10. The setup/hold time control circuit as set forth in claim 9, wherein the first control unit comprises:
    a first path selecting unit selecting an output path of the comparative signal in accordance with the second control signal;
    a first delay unit, which is selected if the second control signal is disabled, to delay the comparative signal by a prescribed time; and
    a first output unit logically combining an output of the first path selecting unit selected if the second control signal is enabled with an output of the first delay unit and outputting the combined result.

11. The setup/hold time control circuit as set forth in claim 10, wherein the first path selecting unit comprises:

an eighth NAND gate outputting the comparative signal to the first delay unit if the second control signal is disabled; and a ninth NAND gate outputting the comparative signal to the first output unit if the second control signal is enabled.

12. The setup/hold time control circuit as set forth in claim 10, wherein the first output unit comprises:

a tenth NAND gate NAND-combining an output of the first path selecting unit with an output of the first delay unit; and an eighth inverter inverting an output of the tenth NAND gate.

13. The setup/hold time control circuit as set forth in claim 9, wherein the second control unit comprises:

a second path selecting unit selecting a path of the output signal of the first control unit in accordance with the first control signal;

a second delay unit, which is selected if the first control signal is enabled, to delay the output signal of the first control unit by a prescribed time; and a second output unit which logically combines an output of the second path selecting unit selected if the first control signal is disabled with an output of the second delay unit and outputting the combined result.

14. The setup/hold time control circuit as set forth in claim 13, wherein the second path selecting unit comprises:

an eleventh NAND gate outputting the output signal of the first control unit to the second output unit if the first control signal is disabled; and a twelfth NAND gate outputting the output signal of the first control unit to the second delay unit if the first control signal is enabled.

15. The setup/hold time control circuit as set forth in claim 13, wherein the second output unit comprises:

a thirteenth NAND gate NAND-combining an output of the second path selecting unit with an output of the second delay unit; and a ninth inverter inverting an output of the tenth NAND gate.

16. A setup/hold time control circuit, comprising:

a first buffer receiving a signal input from a first port and outputting a reference signal;

a second buffer receiving a signal input from a second port and outputting a comparative signal;

a comparison latch unit comparing input time points of the reference signal and the comparative signal and outputting a signal corresponding to the comparison result as a control signal if the test mode is enabled; and a control unit outputting the comparative signal as an internal signal by using the control signal to control an output time point of the comparative signal such that the output time point of the comparative signal is synchronized with an output time point of the reference signal, wherein the comparison latch unit includes:

a comparing unit for comparing an input time point of the reference signal with an input time point of the comparative signal and outputting a first detect signal and a second detect signal if the test mode signal is enabled; and a latch unit selectively enabling the control signal in accordance with an enable sequence of the first and second detect signals and outputting the control signal.

17. The setup/hold time control circuit as set forth in claim 16, wherein the comparing unit comprises:

a first comparing unit making an enable time point of the first detect signal earlier than an enable time point of the second detect signal if the input time point of the comparative signal is faster than the input time point of the reference signal; and a second comparing unit making the enable time point of the second detect signal earlier than the enable timepoint of the first detect signal if the input time point of the comparative signal is slower than the input time point of the reference signal.

18. The setup/hold time control circuit as set forth in claim 16, wherein the latch unit outputs the control signal as an enabled first control signal if the first detect signal is enabled earlier than the second detect signal and an enabled second control signal if the second detect signal is enabled earlier than the first detect signal.

19. The setup/hold time control circuit as set forth in claim 18, wherein the control unit comprises:

a first control unit reducing a delay of the comparative signal while the second control signal is enabled;

a second control unit increasing a delay of an output signal of the first control unit while the first control signal is enabled; and wherein the second control units output is the internal signal.

20. The setup/hold time control circuit as set forth in claim 19, wherein the first control unit comprises:

a first path selecting unit selecting a path of the comparative signal in accordance with the second control signal;

a first delay unit, which is selected if the second control signal is disabled, to delay the comparative signal by a prescribed time; and a first output unit logically combining an output of the first path selecting unit selected if the second control signal is enabled with an output of the first delay unit and outputting the combined result.

21. The setup/hold time control circuit as set forth in claim 19, wherein the second control unit comprises:

a second path selecting unit selecting a path of the output signal of the first control unit in accordance with the first control signal;

a second delay unit, which is selected if the first control signal is enabled to delay the output signal of the first control unit by a prescribed time; and a second output unit logically combining an output of the second path selecting unit selected if the first control signal is disabled with an output of the second delay unit and outputting the combined result.

* * * * *